(12) United States Patent
Ishii et al.

(10) Patent No.: US 8,314,338 B2
(45) Date of Patent: Nov. 20, 2012

(54) WIRED CIRCUIT BOARD AND CONNECTION STRUCTURE BETWEEN WIRED CIRCUIT BOARDS

(75) Inventors: Jun Ishii, Osaka (JP); Yasunari Ooyabu, Osaka (JP); Takeshi Tanaka, Osaka (JP); Toshiki Naito, Osaka (JP)

(73) Assignee: Nitto Denko Corporation, Osaka (JP)

( * ) Notice: Subject to any disclaimer, the term of this patent is extended or adjusted under 35 U.S.C. 154(b) by 687 days.

(21) Appl. No.: 12/219,343

(22) Filed: Jul. 21, 2008

(65) Prior Publication Data

US 2009/0044969 A1 Feb. 19, 2009

Related U.S. Application Data

(60) Provisional application No. 60/960,581, filed on Oct. 4, 2007.

(30) Foreign Application Priority Data

Jul. 20, 2007 (JP) ................................. 2007-189942

(51) Int. Cl.
H05K 1/03 (2006.01)
H05K 1/11 (2006.01)
H05K 1/14 (2006.01)

(52) U.S. Cl. ........................................ 174/255; 361/784

(58) Field of Classification Search .................. 174/254, 174/255; 439/62, 65, 55; 361/719, 786, 361/803, 760; 257/E23.169

See application file for complete search history.

(56) References Cited

U.S. PATENT DOCUMENTS

| | | | | |
|---|---|---|---|---|
| 4,931,021 A * | 6/1990 | Mohan | ........................... | 439/285 |
| 5,071,363 A * | 12/1991 | Reylek et al. | .................. | 439/291 |
| 5,219,292 A * | 6/1993 | Dickirson et al. | ............... | 439/67 |
| 5,267,866 A * | 12/1993 | Swift et al. | ........................ | 439/31 |
| 5,808,529 A * | 9/1998 | Hamre | ........................... | 333/246 |
| 6,388,201 B2 * | 5/2002 | Yamato et al. | ................ | 174/255 |
| 6,440,775 B2 * | 8/2002 | Khoury | ........................... | 438/107 |
| 6,512,293 B1 * | 1/2003 | Chia et al. | ....................... | 257/730 |
| 6,717,059 B2 | 4/2004 | Shintani et al. | | |
| 7,286,370 B2 | 10/2007 | Ooyabu | | |
| 2002/0080590 A1 * | 6/2002 | Bauermeister | ................. | 361/803 |

FOREIGN PATENT DOCUMENTS

| | | |
|---|---|---|
| JP | 2002-124756 | 4/2002 |
| JP | 2005-243970 | 9/2005 |
| JP | 2005-340385 | 12/2005 |
| JP | 2007-088296 | 4/2007 |

* cited by examiner

*Primary Examiner* — Timothy Thompson
*Assistant Examiner* — Roshn Varghese
(74) *Attorney, Agent, or Firm* — Jean C. Edwards, Esq.; Edwards Neils PLLC

(57) ABSTRACT

A wired circuit board includes a first wired circuit board and a second wired circuit board disposed to be opposed to the first wired circuit board in the same plane. A first opposed surface of the first wired circuit board facing the second wired circuit board and a second opposed surface of the second wired circuit board facing the first wired circuit board include at least two types of interfitting surfaces extending in different directions so as to mutually interfit the first opposed surface with the second opposed surface.

6 Claims, 6 Drawing Sheets

FIG. 2
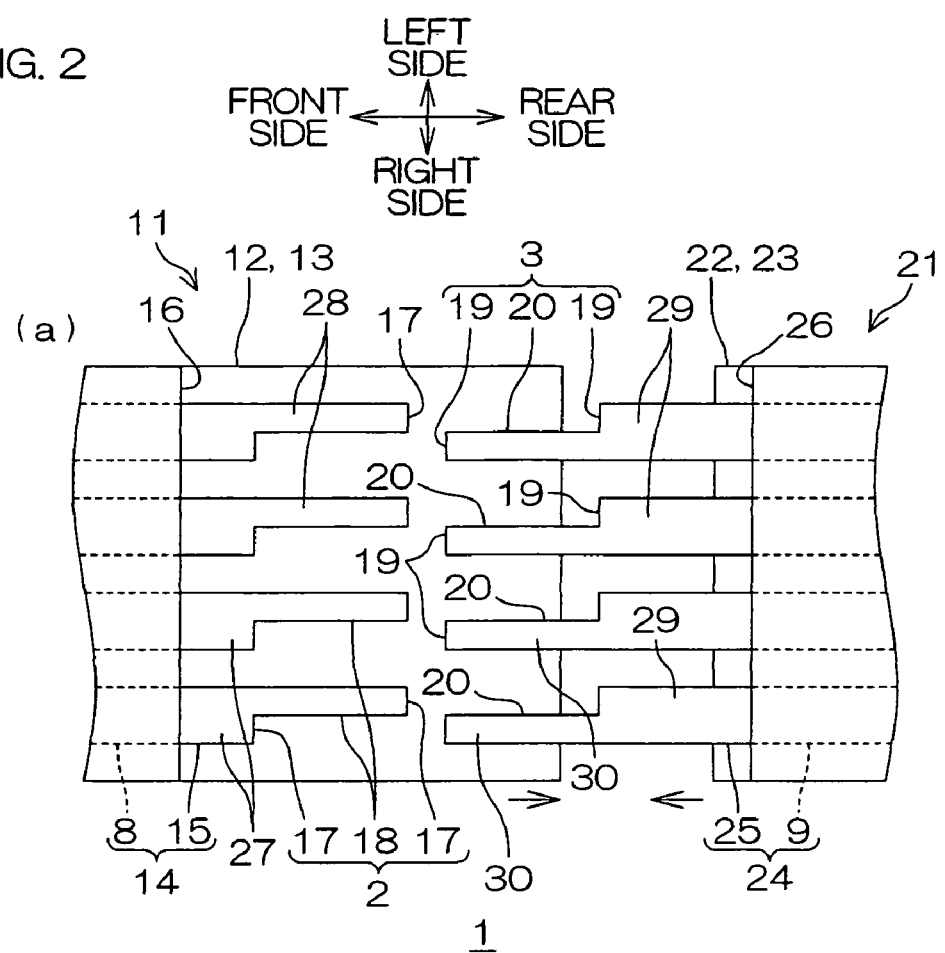
(a)
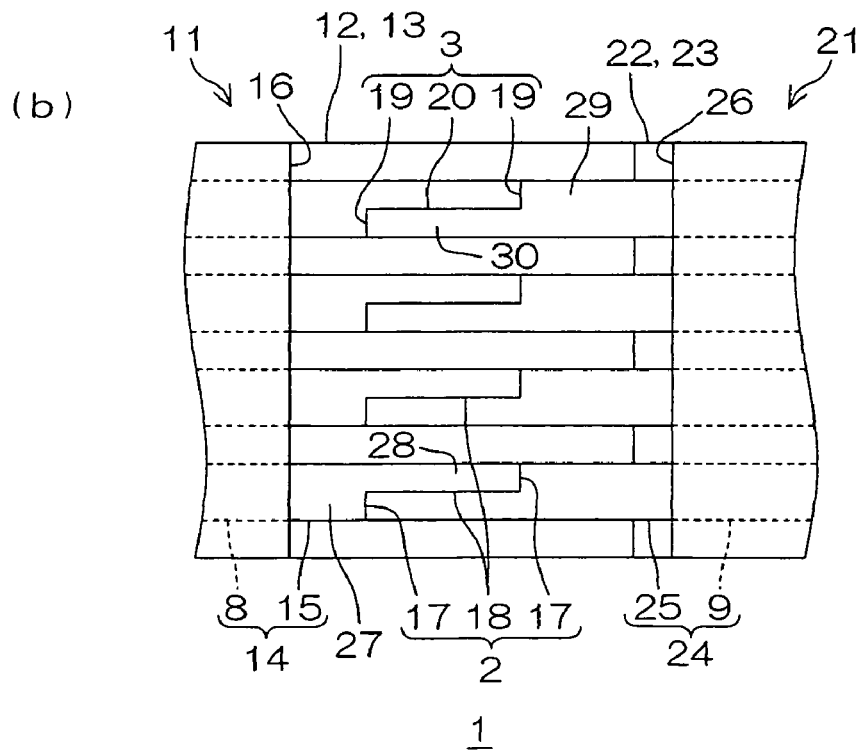
(b)

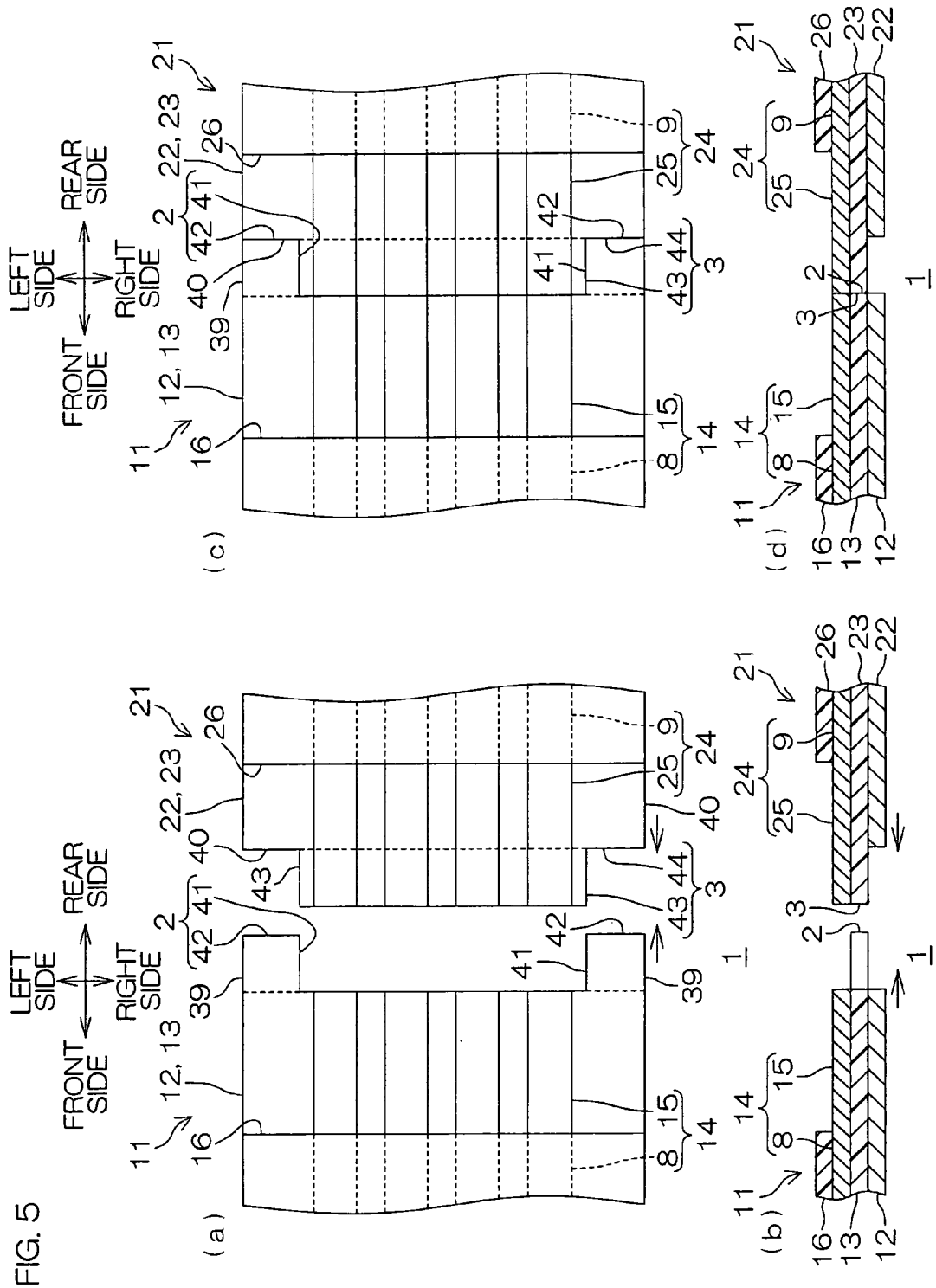

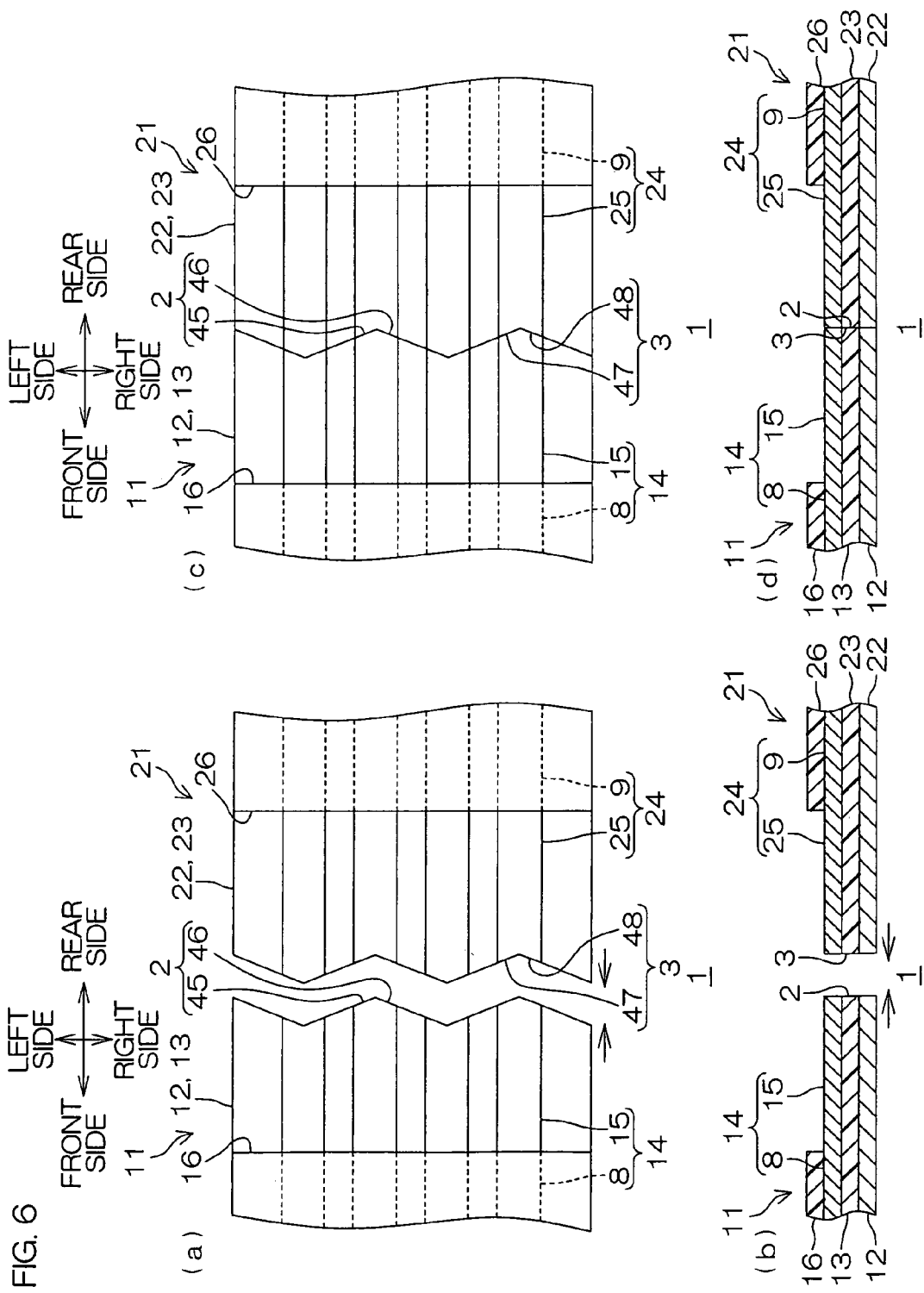

WIRED CIRCUIT BOARD AND CONNECTION STRUCTURE BETWEEN WIRED CIRCUIT BOARDS

CROSS REFERENCE TO RELATED APPLICATION

This application claims the benefit of U.S. Provisional Application No. 60/960,581, filed Oct. 4, 2007, and claims priority from Japanese Patent Application No. 2007-189942, filed Jul. 20, 2007, the contents of which are herein incorporated by reference in their entirety.

BACKGROUND OF THE INVENTION

1. Field of the Invention

The present invention relates to a wired circuit board and to a connection structure between wired circuit boards. More particularly, the present invention relates to a wired circuit board in which two wired circuit boards are connected and to a connection structure therebetween.

2. Description of the Related Art

Conventionally, various connection structures between wired circuit boards have been proposed to connect two wired circuit boards.

For example, a connection structure between wired circuit boards as shown below is proposed for visual inspection of electrical connections between the first connection terminals of a first wired circuit board and the second connection terminals of a second wired circuit board via solder bumps (see, e.g., Japanese Unexamined Patent No. 2005-340385).

That is, in the connection between the first wired circuit board and the second wired circuit board, the first connection terminals and the second connection terminals are abutted against each other in a direction in which they are opposed along the longitudinal directions thereof to be arranged in line. Then, the solder bump is provided continuously over the surface of the first connecting terminal and the surface of the second connecting terminal so as to interpose therebetween.

SUMMARY OF THE INVENTION

However, in the proposal mentioned above, the end surface of the first wired circuit board and that of the second wired board are formed flat along a widthwise direction perpendicular to the opposed direction. Therefore, even when the end surface of the first wired circuit board and the end surface of the second wired circuit board are abutted, the respective end surfaces thereof may be displaced from each other in the widthwise direction. As a result, it becomes difficult to arrange the first connection terminal and the second connection terminal in line.

When a particular consideration is given to a recent conductive pattern which has a higher density and an increased number of wires, precise positioning of the first connecting terminal and the second connecting terminal is necessary, but such positioning becomes more difficult.

It is therefore an object of the present invention to provide a wired circuit board and a connection structure between wired circuit boards which can ensure precise positioning of a first wired circuit board and a second wired circuit board and improve reliability.

A wired circuit board of the present invention comprises a first wired circuit board, and a second wired circuit board disposed to be opposed to the first wired circuit board in the same plane, wherein a first opposed surface of the first wired circuit board facing the second wired circuit board and a second opposed surface of the second wired circuit board facing the first wired circuit board comprise at least two types of interfitting surfaces extending in different directions so as to mutually interfit the first opposed surface with the second opposed surface.

In the wired circuit board, the first opposed surface of the first wired circuit board and the second opposed surface of the second wired circuit board comprise the at least two types of interfitting surfaces extending in different directions. Therefore, by mutually interfitting the interfitting surfaces of the first opposed surface with the interfitting surfaces of the second opposed surface, it is possible to accurately position the first wired circuit board and the second wired circuit board and prevent a relative displacement therebetween. This can ensure accurate positioning of the first wired circuit board and the second wired circuit board and improve reliability.

In the wired circuit board of the present invention, it is preferable that the first wired circuit board comprises a first insulating layer and a first conductive layer laminated on a surface of the first insulating layer, the second wired circuit board comprises a second insulating layer and a second conductive layer laminated on a surface of the second insulating layer, and the interfitting surfaces are provided in the first conductive layer and in the second conductive layer.

In the wired circuit board, the first wired circuit board and the second wired circuit board can be positioned by mutually interfitting the interfitting surfaces of the first conductive layer with the interfitting surfaces of the second conductive layer. In addition, the interfitting surfaces are provided in the first conductive layer and the second conductive layer which are higher in rigidity than the insulating layers. This can ensure accurate positioning of the first wired circuit board and the second wired circuit board and more reliably prevent a relative displacement therebetween.

In the wired circuit board of the present invention, it is preferable that the first conductive layer comprises a first terminal portion for connection to the second conductive layer, and the second conductive layer comprises a second terminal portion for connection to the first conductive layer, wherein the interfitting surfaces are provided in the first terminal portion and in the second terminal portion, and the first terminal portion and the second terminal portion are formed to have substantially equal lengths in a direction perpendicular to a direction in which the first terminal portion and the second terminal portion are connected.

In the wired circuit board, the first terminal portion and the second terminal portion connected to each other are formed to have substantially equal lengths in the direction perpendicular to the direction in which they are connected. This allows impedance matching between the first conductive layer and the second conductive layer. As a result, it is possible to achieve effective signal transmission.

In the wired circuit board of the present invention, it is preferable that the first wired circuit board comprises a first metal supporting layer, a first insulating layer laminated on a surface of the first metal supporting layer, and the first conductive layer laminated on a surface of the first insulating layer, the second wired circuit board comprises a second metal supporting layer, a second insulating layer laminated on a surface of the second metal supporting layer, and the second conductive layer laminated on a surface of the second insulating layer, and the interfitting surfaces are provided in the first metal supporting layer and in the second metal supporting layer.

In the wired circuit board, the first wired circuit board and the second wired circuit board can be positioned by mutually interfitting the interfitting surfaces of the first metal supporting layer with the interfitting surfaces of the second metal supporting layer. In addition, the interfitting surfaces are provided in the first metal supporting layer and the second metal supporting layer which are higher in rigidity than the insulating layers and the conductive layers. This can ensure accurate positioning of the first wired circuit board and the second wired circuit board and more reliably prevent a relative displacement therebetween.

In the wired circuit board of the present invention, it is preferable that either the interfitting surfaces of the first wired circuit board or the interfitting surfaces of the second wired circuit board are formed in a chevron shape extending along a direction intersecting both of a direction in which the first wired circuit board and the second wired circuit board are opposed and a direction perpendicular to the opposed direction, while the other interfitting surfaces are formed in a trough shape interfitting with the chevron shape.

In the wired circuit board, by interfitting the chevron-shaped interfitting surfaces provided in either one of the first wired circuit board or the second wired circuit board with the trough-shaped interfitting surfaces provided in the other, it is possible to accurately position the first wired circuit board and the second wired circuit board and prevent a relative displacement therebetween.

In particular, the chevron shape is formed along the direction intersecting both of the direction in which the first wired circuit board and the second wired circuit board are opposed and the direction perpendicular to the opposed direction. Accordingly, it is possible to reliably prevent a relative displacement between the first wired circuit board and the second wired circuit board along the direction perpendicular to the direction in which the first wired circuit board and the second wired circuit board are opposed.

A connection structure between wired circuit boards of the present invention is a connection structure between wired circuit boards for connecting a first wired circuit board and a second wired circuit board, wherein the second wired circuit board is disposed to be opposed to the first wired circuit board in the same plane, and a first opposed surface of the first wired circuit board facing the second wired circuit board and a second opposed surface of the second wired circuit board facing the first wired circuit board comprise two types of interfitting surfaces extending in different directions so as to mutually interfit the first opposed surface with the second opposed surface.

In the connection structure between the wired circuit boards, the first opposed surface of the first wired circuit board and the second opposed surface of the second wired circuit board comprise the at least two types of interfitting surfaces extending in different directions. Therefore, by mutually interfitting the interfitting surfaces of the first opposed surface with the interfitting surfaces of the second opposed surface, it is possible to accurately position the first wired circuit board and the second wired circuit board and prevent a relative displacement therebetween. This can ensure accurate positioning of the first wired circuit board and the second wired circuit board and improve reliability.

BRIEF DESCRIPTION OF THE DRAWINGS

FIG. 2 shows a wired circuit board and a connection structure between wired circuit boards according to another embodiment (in which each of first terminal portions and second terminal portions has a stepped shape) of the present invention, (a) showing a plan view of the wired circuit boards before connection, and (b) showing a plan view of the wired circuit board after connection;

FIG. 5 shows a wired circuit board and a connection structure between wired circuit boards according to still another embodiment (in which the first opposed surfaces and the second opposed surfaces are provided in a first insulating base layer and in a second insulating base layer, respectively) of the present invention, (a) showing a plan view of the wired circuit boards before connection, (b) showing a cross-sectional view of FIG. 5(a) along the front-to-rear direction, (c) showing a plan view of the wired circuit board after connection, and (d) showing a cross-sectional view of FIG. 5(c) along the front-to-rear direction; and FIG. 6 shows a wired circuit board and a connection structure between wired circuit boards according to yet another embodiment (in which the first opposed surfaces and the second opposed surfaces are provided in the first metal supporting layer, the first insulating base layer and a first conductive layer, and in the second metal supporting layer, the second insulating base layer and a second conductive layer, respectively) of the present invention, (a) showing a plan view of the wired circuit boards before connection, (b) showing a cross-sectional view of FIG. 6(a) along the front-to-rear direction, (c) showing a front view of the wired circuit board after connection, and (d) showing a cross-sectional view of FIG. 6(c) along the front-to-rear direction.

DETAILED DESCRIPTION OF THE INVENTION

Figure 1:
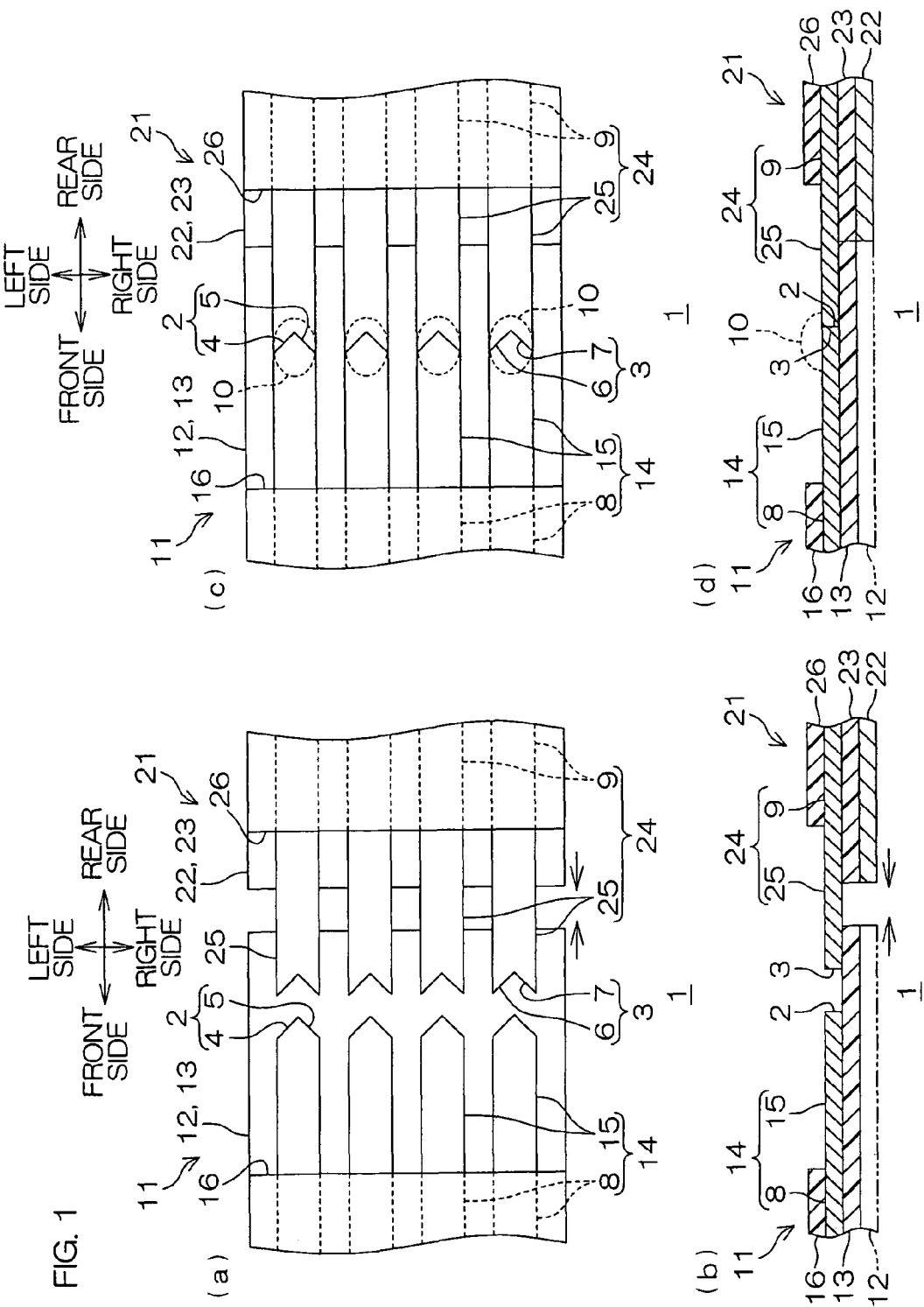
FIG. 1 shows a wired circuit board and a connection structure between wired circuit boards according to an embodiment of the present invention, (a) showing a plan view of the wired circuit boards before connection, (b) showing a cross-sectional view of FIG. 1(a) along a front-to-rear direction, (c) showing a plan view of the wired circuit board after connection, and (d) showing a cross-sectional view of FIG. 1(c) along the front-to-rear direction.

FIG. 1 shows a wired circuit board and a connection structure between wired circuit boards according to an embodiment of the present invention, (a) showing a plan view of the wired circuit boards before connection, (b) showing a cross-sectional view of FIG. 1(a) along a front-to-rear direction, (c) showing a plan view of the wired circuit board after connection, and (d) showing a cross-sectional view of FIG. 1(c) along the front-to-rear direction.

In FIGS. 1(a) and 1(c), the left side is defined as "front side", the right side is "rear side", the upper side is "left side", and the lower side is "right side".

In FIG. 1, the wired circuit board 1 includes a first wired circuit board 11 and a second wired circuit board 21. The first wired circuit board 11 and the second wired circuit board 21 are disposed to be opposed to each other in a front-to-rear direction such that the rear end portion of the first wired circuit board 11 is abutted against the front end portion of the second wired circuit board 21 in the same plane.

The first wired circuit board 11 is formed to have a generally rectangular shape extending in the front-to-rear direction when viewed in plan view. An example of the first wired circuit board 11 is a flexible wired circuit board with a reinforcing layer. The first wired circuit board 11 includes a first metal supporting layer 12 as the reinforcing layer, a first insulating base layer 13 as a first insulating layer formed on the first metal supporting layer 12, a first conductive layer 14 formed on the first insulating base layer 13, and a first insulating cover layer 16 formed on the first insulating base layer 13 so as to cover the first conductive layer 14.

The second wired circuit board 21 is formed to have a generally rectangular shape extending in the front-to-rear direction when viewed in plan view. An example of the second wired circuit board 21 is a suspension board with circuit. The second wired circuit board 21 includes a second metal supporting layer 22 as a suspension, a second insulating base layer 23 as a second insulating layer formed on the second metal supporting layer 22, a second conductive layer 24 formed on the second insulating base layer 23, and a second insulating cover layer 26 formed on the second insulating base layer 23 so as to cover the second conductive layer 24.

The first metal supporting layer 12 and the second metal supporting layer 22 are each made of a metal foil of, e.g., stainless steel, a 42-alloy, aluminum, a copper-beryllium alloy, phosphor bronze, or the like. The thicknesses of the first metal supporting layer 12 and the second metal supporting layer 22 are in the range of, e.g., 10 to 50 µm.

The first metal supporting layer 12 is optionally provided and formed on the back surface of the first insulating base layer 13 to be opposed to first terminal portions 15 (described later) in a thickness direction and extend in the front-to-rear direction. The rear end surface of the first metal supporting layer 12 is formed to linearly extend along a left-to-right direction and disposed to be opposed to the front end surface of the second metal supporting layer 22 in the front-to-rear direction.

The second metal supporting layer 22 is formed to extend in the front-to-rear direction so as to correspond to the outer shape of the second wired circuit board 21. The front end surface of the second metal supporting layer 22 is formed to linearly extend along the left-to-right direction.

The first insulating base layer 13 and the second insulating base layer 23 are each made of a resin film of, e.g., a polyimide resin, a polyester resin, an acrylic resin, a polyether nitrile resin, a polyether sulfone resin, a polyethylene terephthalate resin, a polyethylene naphthalate resin, a polyvinyl chloride resin, or the like. Preferably, the first insulating base layer 13 and the second insulating base layer 23 are made of a polyimide resin film. The thicknesses of the first insulating base layer 13 and the second insulating base layer 23 are adjusted to be generally the same and in the range of, e.g., 5 to 50 µm.

The first insulating base layer 13 and the second insulating base layer 23 are formed by a known method such as sticking of a resin film, and casting and photoprocessing of a resin solution.

The first insulating base layer 13 is formed to correspond to the outer shape of the first wired circuit board 11. The rear end surface of the first insulating base layer 13 is formed to linearly extend along the left-to-right direction and disposed to be opposed to the front end surface of the second insulating base layer 23 in the front-to-rear direction. The rear end surface of the first insulating base layer 13 is formed to be flush with the rear end surface of the first metal supporting layer 12 in the front-to-rear direction.

The second insulating base layer 23 is laminated on the entire surface of the second metal supporting layer 22 to correspond to the outer shape of the second wired circuit board 21. The front end surface of the second insulating base layer 23 is formed to linearly extend along the left-to-right direction. The front end surface of the second insulating base layer 23 is formed to be flush with the front end surface of the second metal supporting layer 22 in the front-to-rear direction.

The first conductive layer 14 and the second conductive layer 24 are each made of a metal foil of, e.g., copper, chromium, nickel, aluminum, stainless steel, a copper-beryllium alloy, phosphor bronze, an iron-nickel alloy, or an alloy thereof. Preferably, the first conductive layer 14 and the second conductive layer 24 are made of a copper foil. The thicknesses of the first conductive layer 14 and the second conductive layer 24 are adjusted to be generally the same and in the range of, e.g., 10 to 35 µm.

The first conductive layer 14 and the second conductive layer 24 are formed by a known patterning method such as, e.g., an additive method or a subtractive method.

The first conductive layer 14 integrally includes a plurality of (four) first wiring portions 8 extending along the front-to-rear direction and arranged to be parallel with and spaced apart from each other in the left-to-right direction, the first terminal portions 15 disposed on the respective rear ends of the first wiring portions 8, and front-side terminal portions disposed on the respective front ends of the first wiring portions 8, though not shown. The first wiring portions 8 are covered with a first insulating cover layer 16 described later. The first terminal portions 15 are each exposed from the first insulating cover layer 16.

The first terminal portions 15 are connection terminals for connection to the second conductive layer 24 and disposed to extend rearward from the first wiring portions 8 to positions more forward than (anterior to) the rear end surface of the first insulating base layer 13. The rear end portions of the first terminal portions 15 are each formed to have a generally V-shape projected rearward.

The rear end surfaces of the rear end portions of the first terminal portions 15 are opposed to second terminal portions 25 (described later) in the front-to-rear direction. Specifically, the rear end surfaces of the rear end portions of the first terminal portions 15 serve as first opposed surfaces 2 formed to interfit with the second opposed surfaces 3 of the second terminal portions 25.

Each of the first opposed surfaces 2 includes two types of interfitting surfaces extending in different directions. These interfitting surfaces extend in directions intersecting both of the front-to-rear-direction and the left-to-right direction.

That is, the first opposed surface 2 includes a first interfitting surface 4 linearly inclined rightward from the left end of the first terminal portion 15 toward the rear side and a second interfitting surface 5 linearly inclined leftward from the right end of the first terminal portion 15 toward the rear side. The rear end edge of the first interfitting surface 4 is continued to that of the second interfitting surface 5 so that the first interfitting surface 4 and the second interfitting surface 5 form a rearwardly projected chevron shape.

The length (width) of the first terminal portion 15 in the left-to-right direction is in the range of, e.g., 10 to 200 µm. The length of the first terminal portion 15 in the front-to-rear direction is in the range of, e.g., 50 to 500 µm. The length between the center of the rear end edge of the first terminal portion 15 and the rear end surface of the first metal supporting layer 12 is in the range of, e.g., 40 to 400 µm.

The second conductive layer 24 integrally includes a plurality of (four) second wiring portions 9 extending along the front-to-rear direction and arranged to be parallel with and spaced apart from each other in the left-to-right direction, the second terminal portions 25 disposed on the respective front ends of the second wiring portions 9, and rear-side terminal portions disposed on the respective rear ends of the second wiring portions 9, though not shown. The second wiring portions 9 are covered with a second insulating cover layer 26 described later. The second terminal portions 25 are each exposed from the second insulating cover layer 26.

The second terminal portions 15 are connection terminals for connection to the first conductive layer 14 and disposed to project forward from the second wiring portions 9 to positions more forward than the front end surface of the second insulating base layer 23. The front end portions of the second terminal portions 25 are each formed to have a generally V-shape recessed rearward.

The front end surfaces of the front end portions of the second terminal portions 25 are opposed to the first terminal portions 15 in the front-to-rear direction. Specifically, the front end surfaces of the front end portions of the second terminal portions 25 serve as the second opposed surfaces 3 formed to interfit with the first opposed surfaces 2 of the first terminal portions 15.

Each of the second opposed surfaces 3 includes two types of interfitting surfaces extending in different directions. These interfitting surfaces extend in directions intersecting both of the front-to-rear-direction and the left-to-right direction.

That is, the second opposed surface 3 includes a third interfitting surface 6 linearly inclined rightward from the left end of the second terminal portion 25 toward the rear side and a fourth interfitting surface 7 linearly inclined leftward from the right end of the second terminal portion 25 toward the rear side. The rear end edge of the third interfitting surface 6 is continued to that of the fourth interfitting surface 7 so that the third interfitting surface 6 and the fourth interfitting surface 7 form a rearwardly recessed trough shape.

The second terminal portion 25 is formed to have a length (width) in the left-to-right direction substantially equal to the length of the first terminal portion 15 in the left-to-right direction. The length of the second terminal portion 25 in the front-to-rear direction is in the range of, e.g., 50 to 500 µm. The length between the both ends of the front end edge of the second terminal portion 25 and the front end surface of the second insulating base layer 23 is in the range of, e.g., 40 to 400 µm.

The first insulating cover layer 16 and the second insulating cover layer 26 are made of the same resin film as that of the first insulating base layer 13 and the second insulating base layer 23. The thickness of the first insulating cover layer 16 and the thickness of the second insulating cover layer 26 are adjusted to be substantially the same and in the range of, e.g., 4 to 50 µm. The first insulating cover layer 16 and the second insulating cover layer 26 are formed by a known method such as sticking of a resin film, and casting and photoprocessing of a resin solution.

The first insulating cover layer 16 is formed on the surface of the first insulating base layer 13 so as to cover the first wiring portions 8 and expose the first terminal portions 15 and the front terminal portions not shown. The rear end surface of the first insulating cover layer 16 is disposed anterior to and parallel with the rear end surface of the first insulating base layer 13.

The second insulating cover layer 26 is formed on the surface of the second insulating base layer 23 to cover the second wiring portions 9 and expose the second terminal portions 25 and the rear terminal portions not shown. The front end surface of the second insulating cover layer 26 is disposed posterior to and parallel with the front end surface of the second insulating base layer 23.

Next, a description will be given to a method for obtaining the wired circuit board 1 in which the first wired circuit board 11 and the second wired circuit board 21 are connected by abutting against each other.

First, as shown in FIGS. 1(a) and 1(b), the first wired circuit board 11 and the second wired circuit board 21 are arranged such that the rear end portion of the first wired circuit board 11 and the front end portion of the second wired circuit board 21 are disposed to be opposed to each other in the front-to-rear direction.

Next, as indicated by the arrows of FIG. 1(a), the first wired circuit board 11 is oriented rearward and the second wired circuit board 21 is oriented forward to abut against each other. By this abutment, the first interfitting surface 4 and the second interfitting surface 5 are brought into contact with the third interfitting surface 6 and the fourth interfitting surface 7, respectively, so that the first opposed surfaces 2 and the second opposed surfaces 3 interfit with each other, as shown in FIGS. 1(c) and 1(d). By this abutment, the rear end surface of the first metal supporting layer 12 and the front end surface of the second metal supporting layer 22 linearly are brought into contact with each other along the left-to-right direction. In addition, the rear end surface of the first insulating base layer 13 and the front end surface of the second insulating layer 23 also linearly are brought into contact with each other along the left-to-right direction.

Thereafter, as indicated by the broken line of FIG. 1(d), a solder layer 10, e.g., is formed over the rear end edge of the first terminal portion 15 and the front end edge of the second terminal portion 25 so as to span therebetween. The solder layer 10 is formed by, e.g., application of a solder paste and subsequent application of heat and pressure.

In the wired circuit board 1, each of the first opposed surfaces 2 of the first wired circuit board 11 and the second opposed surfaces 3 of the second wired circuit board 21 includes two types of interfitting surfaces extending in different directions, i.e., the first and second interfitting surfaces 4 and 5 and the third and fourth interfitting surfaces 6 and 7. Therefore, by mutually interfitting the first and second interfitting surfaces 4 and 5 of the first opposed surfaces 2 with the third and fourth interfitting surfaces 6 and 7 of the second opposed surfaces 3, it is possible to accurately position the first wired circuit board 11 and the second wired circuit board 21 and prevent a relative displacement therebetween. This can ensure accurate positioning of the first wired circuit board 11 and the second wired circuit board 21 and improve reliability.

In the wired circuit board 1, the first wired circuit board 11 and the second wired circuit board 21 can be positioned particularly in the left-to-right direction by mutually interfitting the first and second interfitting surfaces 4 and 5 of the first conductive layer 14 with the third and fourth interfitting surfaces 6 and 7 of the second conductive layer 24. In addition, the first interfitting surfaces 4 and the second interfitting surfaces 5 are provided in the first conductive layer 14 which is higher in rigidity than the first insulating base layer 13, while the third interfitting surfaces 6 and the fourth interfitting surfaces 7 are provided in the second conductive layer 24 which is higher in rigidity than the second insulating base layer 23. This can ensure more accurate positioning of the first wired circuit board 11 and the second wired circuit board 21 and more reliably prevent a relative displacement therebetween.

Moreover, in the wired circuit board 1, the first terminal portions 15 and the second terminal portions 25 to be connected to each other are formed to have substantially equal lengths in the left-to-right direction. Accordingly, it is possible to achieve impedance matching between the first conductive layer 14 and the second conductive layer 24. As a result, efficient signal transmission can be achieved.

Further, in the wired circuit board 1, the chevron-shaped interfitting surfaces formed of the first interfitting surfaces 4 and the second interfitting surfaces 5, which are provided in the first wired circuit board 11, and the trough-shaped interfitting surfaces formed of the third interfitting surfaces 6 and the fourth interfitting surfaces 7, which are provided in the second wired circuit board 21, are drawn in to interfit with each other in complementary relation. Therefore, it is possible to accurately position the first wired circuit board 11 and the second wired circuit board 21 in the left-to-right direction and in the front-to-right direction and prevent a relative displacement therebetween.

In particular, the chevron shape is formed along the directions intersecting both of the front-to-rear direction and the left-to-right direction. Accordingly, it is possible to reliably prevent a relative displacement between the first wired circuit board 11 and the second wired circuit board 21 along the left-to-right direction.

In the description given above, the rear end portions of the first terminal portions 15 and the front end portions of the second terminal portions 25 are each formed in the generally V-shape. However, it is also possible to form each of the rear end portions of the first terminal portions 15 and the front end portions of the second terminal portions 25 into, e.g., a stepped shape, as shown in FIG. 2. In the subsequent drawings, members corresponding to the individual components described above are denoted by the same reference numerals and a detailed description thereof is omitted.

In FIG. 2, each of the first terminal portions 15 integrally includes a first base portion 27 disposed on the front end thereof and having a generally rectangular shape when viewed in plan view and a first projected portion 28 projected rearward from the left side of the rear end of the first base portion 27 and having a generally rectangular shape when viewed in plan view.

The first opposed surface 2 includes fifth interfitting surfaces 17 extending in the left-to-right direction and made of the rear end surface of the first base portion 27 and the rear end surface of the first projected portion 28 and a sixth interfitting surface 18 extending in the front-to-rear direction and made of the right surface of the first projected portion 28. The fifth interfitting surface 17 of the first base portion 27 and the sixth interfitting surface 18 are perpendicularly continued, and the sixth interfitting surface 18 and the fifth interfitting surface 17 of the first projected portion 28 are perpendicularly continued. Accordingly, the fifth interfitting surfaces 17 and the sixth fitting surface 18 form the stepped shape of the first opposed surface 2.

The second terminal portion 25 integrally includes a second base portion 29 disposed on the rear end thereof and having a generally rectangular shape when viewed in plan view and a second projected portion 30 projected forward from the right side of the front end of the second base portion 29 and having a generally rectangular shape when viewed in plan view.

The second opposed surface 3 includes seventh interfitting surfaces 19 extending in the left-to-right direction and made of the front end surface of the second base portion 29 and the front end surface of the second projected portion 30 and an eight interfitting surface 20 extending in the front-to-rear direction and made of the left surface of the second projected portion 30. The seventh interfitting surface 19 of the second base portion 29 and the eighth interfitting portion 20 are perpendicularly continued, and the eighth interfitting surface 20 and the seventh interfitting surface 19 of the second projected portion 30 are perpendicularly continued. Accordingly, the seventh interfitting surfaces 19 and the eighth interfitting surface 20 form the stepped shape of the second opposed surface 3.

To obtain the wired circuit board 1, the first wired circuit board 11 and the second wired circuit board 21 are abutted against each other, as indicated by the arrows of FIG. 2(a). By thus abutted the first wired circuit board 11 and the second wired circuit board 21, the fifth interfitting surfaces 17 and the seventh interfitting surfaces 19 are brought into contact with each other in the front-to-rear direction, while the sixth interfitting surfaces 18 and the eighth interfitting surfaces 20 are brought into contact with each other in the left-to-right direction, as shown in FIG. 2(b). As a result, the first opposed surfaces 2 and the second opposed surfaces 3 interfit with each other.

Figure 3:
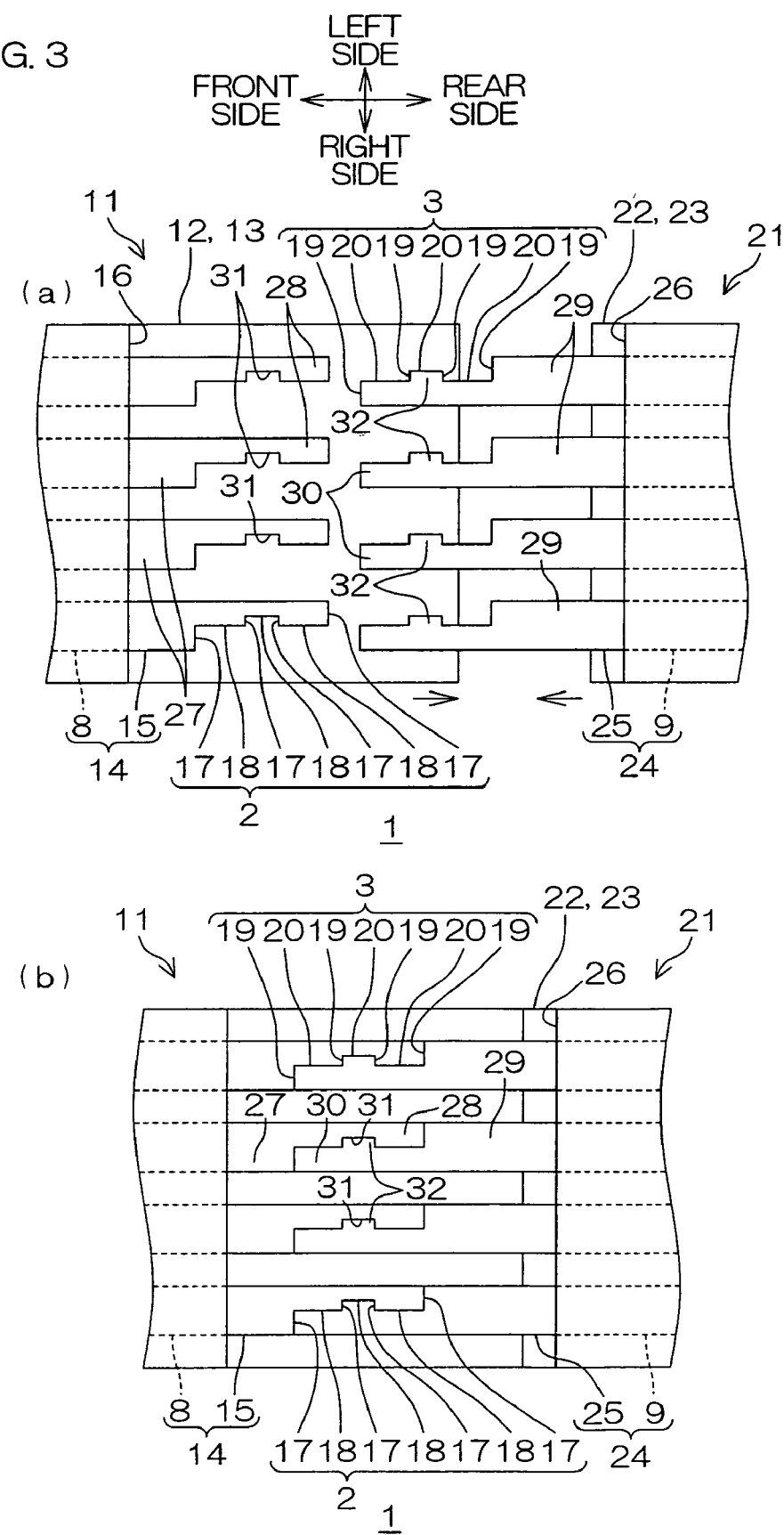
FIG. 3 shows a wired circuit board and a connection structure between wired circuit boards according to still another embodiment (in which sixth interfitting surfaces and eighth interfitting surfaces have depressed/projected shapes) of the present invention, (a) showing a plan view of the wired circuit boards before connection, and (b) showing a plan view of the wired circuit board after connection.

In FIG. 2, the sixth interfitting surface 18 and the eighth interfitting surface 20 are each formed in a flat shape. However, it is also possible to form the sixth interfitting surfaces 18 and the eighth interfitting surfaces 20 into, e.g., depressed/projected shapes, as shown in FIG. 3.

That is, the first projected portion 28 is formed with a first depressed portion 31 in a generally rectangular shape when viewed in plan view and depressed leftward from the sixth interfitting surface 18. In the first depressed portion 31, the front surface and the rear surface of the first depressed portion 31 serve as the fifth interfitting surfaces 17 extending in the left-to-right direction. The left surface of the first depressed portion 31 continued to the two fifth interfitting surfaces 17 serves as the sixth interfitting surface 18 extending in the front-to-rear direction.

Thus, the first opposed surface 2 includes the fifth interfitting surfaces 17 extending in the left-to-right direction and made of the rear end surface of the first base portion 27, the rear end surface of the first projected portion 28, and the front surface and the rear surface of the first depressed portion 31 and the sixth interfitting surface 18 extending in the front-torear direction and made of the right surface of the first projected portion 28 and the left surface of the first depressed portion 31.

The second projected portion 30 is formed with a third projected portion 32 in a generally rectangular shape when viewed in plan view and projected leftward from the eighth interfitting surface 20. In the third projected portion 32, the front surface and the rear surface of the third projected portion 32 serve as the seventh interfitting surfaces 19 extending in the left-to-right direction. The left surface of the third projected portion 32 continued to the two seventh interfitting surfaces 19 serves as the eighth interfitting surface 20 extending in the front-to-rear direction.

Thus, the second opposed surface 3 includes the seventh interfitting surfaces 19 extending in the left-to-right direction and made of the front end surface of the second base portion 29, the front end surface of the second projected portion 30, and the front surface and the rear surface of the third projected portion 32 and the eighth interfitting surface 20 extending in the front-to-rear direction and made of the left surface of the second projected portion 30 and the left surface of the third projected portion 32.

To obtain the wired circuit board 1, the first wired circuit board 11 and the second wired circuit board 21 are abutted against each other, as indicated by the arrows of FIG. 3(a). In this abutment, the first terminal portions 15 and the second terminal portions 25 are spaced apart from each other in the left-to-right direction and then abutted against with each other in the front-to-rear direction to bring the fifth interfitting surfaces 17 of the first projected portions 28 into contact with the seventh interfitting surfaces 19 of the second base portions 29 and bring the seventh interfitting surfaces 19 of the second projected portions 30 into contact with the fifth interfitting surfaces 17 of the first base portions 27. Thereafter, the first terminal portions 15 and the second terminal portions 25 are brought close to each other in the left-to-right direction to engage the third projected portions 32 with the first depressed portions 31.

The method allows accurate positioning in the front-to-rear direction by engaging the third projected portions 32 with the first depressed portions 31, i.e., by bringing the seventh interfitting surfaces 19 and the eighth interfitting surfaces 20 of the third projected portions 32 into contact with the fifth interfitting surfaces 17 and the sixth interfitting surfaces 18 of the first depressed portions 31.

Figure 4:
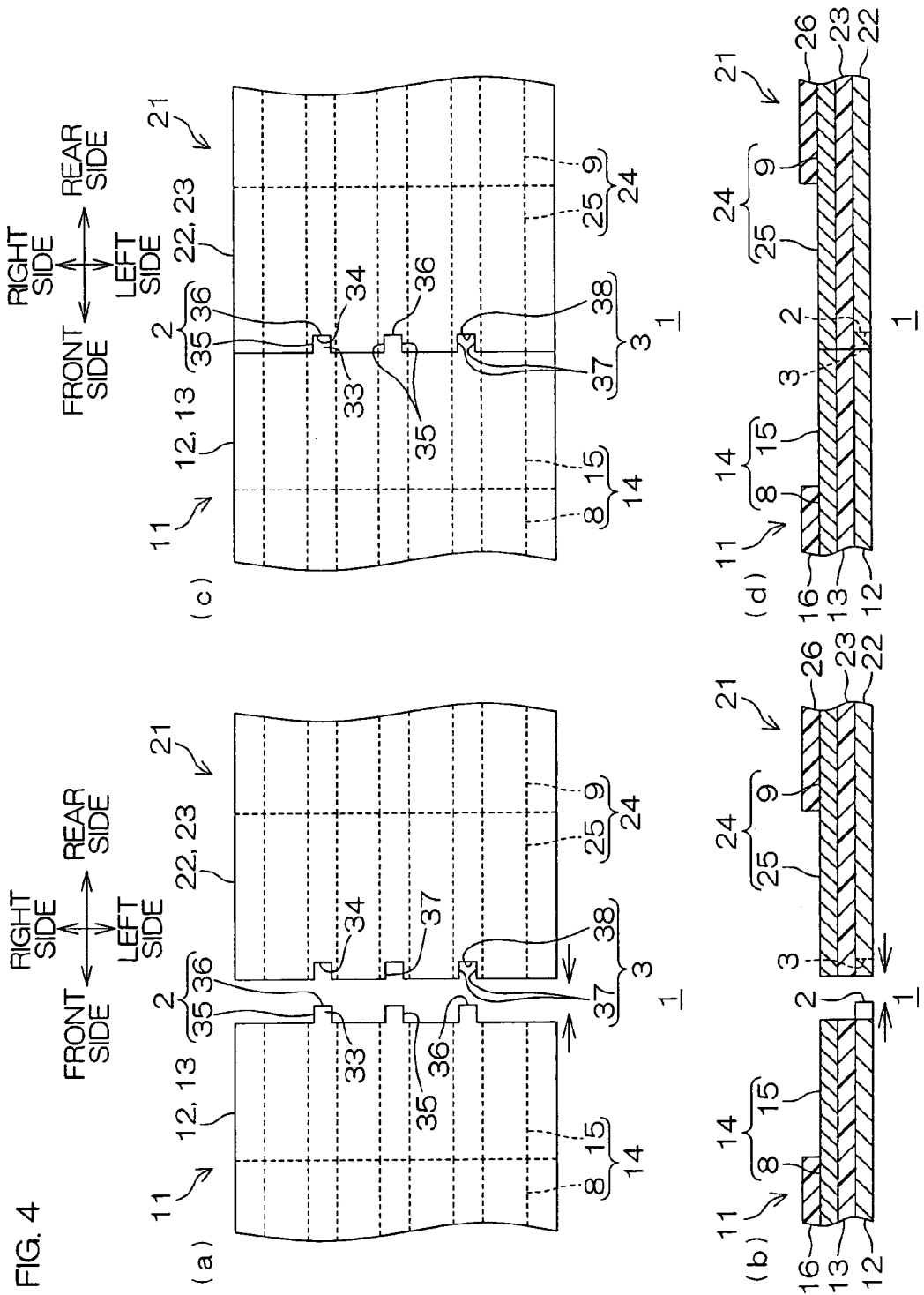
FIG. 4 shows a wired circuit board and a connection structure between wired circuit boards according to yet another embodiment (in which first opposed surfaces and second opposed surfaces are provided in a first metal supporting layer and in a second metal supporting layer, respectively) of the present invention, (a) showing a rear view of the wired circuit boards before connection, (b) showing a cross-sectional view of FIG. 4(a) along the front-to-rear direction, (c) showing a rear view of the wired circuit board after connection, and (d) showing a cross-sectional view of FIG. 4 (c) along the front-to-rear direction.

In the description given above, the first opposed surfaces 2 and the second opposed surfaces 3 are provided in the first conductive layer 14 and in the second conductive layer 24. However, it is also possible to, e.g., provide the first opposed surfaces 2 and the second opposed surfaces 3 in the first metal supporting layer 12 and in the second metal supporting layer 22, as shown in FIG. 4. FIG. 4 shows a wired circuit board and a connection structure between wired circuit boards according to yet another embodiment (in which the first opposed surfaces and the second opposed surfaces are provided in the first metal supporting layer and in the second metal supporting layer, respectively) of the present invention, (a) showing a rear view of the wired circuit boards before connection, (b) showing a cross-sectional view of FIG. 4(a) along the front-to-rear direction, (c) showing a rear view of the wired circuit board after connection, and (d) showing a cross-sectional view of FIG. 4(c) along the front-to-rear direction.

In FIG. 4, the rear end surfaces of the first terminal portions 15 are formed linearly along the left-to-right direction to be flush with the rear end surface of the first insulating base layer 13 in the front-to-rear direction. The front end surface of the second terminal portions 25 are formed linearly along the left-to-right direction to be flush with the front end surface of the second insulating base layer 23 in the front-to-rear direction.

The rear end portion of the first metal supporting layer 12 is formed with fourth projected portions 33 between the individual first terminal portions 15 to project rearward from the rear end surface and having a generally rectangular shape when viewed in plan view. In each of the fourth projected portions 33, the left surface and the right surface of the fourth projected portions 33 serve as ninth interfitting surfaces 35 extending in the front-to-rear direction. The rear surface of the fourth projected portion 33 serves as a tenth interfitting surface 36 extending in the left-to-right direction and continued to the two ninth interfitting surfaces 35.

Thus, the first opposed surface 2 includes the ninth interfitting surfaces 35 and the tenth interfitting surface 36.

The front end portion of the second metal supporting layer 22 is formed with second depressed portions 34 between respective the individual second terminal portions 25 to be depressed rearward from the front end surface and having a generally rectangular shape when viewed in plan view. In each of the second depressed portions 34, the left surface and the right surface of the second depressed portions 34 serve as eleventh interfitting surfaces 37 extending in the front-to-rear direction. The rear surface of the second depressed portion 34 serves as a twelfth interfitting surface 38 extending in the left-to-right direction and continued to the two eleventh interfitting surfaces 37.

Thus, the second opposed surface 3 includes the eleventh interfitting surfaces 37 and the twelfth interfitting surface 38.

To obtain the wired circuit board 1, the first wired circuit board 11 and the second wired circuit board 21 are abutted against each other, as indicated by the arrows of FIG. 4(a). By this abutment, the fourth projected portions 33 are engaged with the second depressed portions 34, as shown in FIG. 4(c). As a result, the ninth interfitting surfaces 35 and the tenth interfitting surfaces 36 are brought into contact with the eleventh interfitting surfaces 37 and the twelfth interfitting surfaces 38, respectively, so that the first opposed surfaces 2 and the second opposed surfaces 3 interfit with each other.

In the wired circuit board 1, the first wired circuit board 11 and the second wired circuit board 21 can be positioned in the left-to-right direction by interfitting the ninth interfitting surfaces 35 and the tenth interfitting surfaces 36 of the first metal supporting layer 12 with the eleventh interfitting surfaces 37 and the twelfth interfitting surfaces 38 of the second metal supporting layer 22. In addition, the ninth interfitting surfaces 35 and the tenth interfitting surfaces 36 are provided in the first metal supporting layer 12 which is higher in rigidity than the first insulating base layer 13 and the first conductive layer 14, while the eleventh interfitting surfaces 37 and the twelfth interfitting surfaces 38 are provided in the second metal supporting layer 22 which is higher in rigidity than the second insulating base layer 23 and the second conductive layer 24. This can ensure accurate positioning of the first wired circuit board 11 and the second wired circuit board 21 and more reliably prevent a relative displacement therebetween.

Alternatively, it is also possible to, e.g., provide the first opposed surfaces 2 and the second opposed surfaces 3 in the first insulating base layer 13 and in the second insulating base layer 14, as shown in FIG. 5.

In FIG. 5, the rear end surface of the first metal supporting layer 12, the rear end surface of the first insulating base layer 13, and the rear end surfaces of the first terminal portions 15 are formed to be flush with each other in the front-to-rear direction.

The rear end portion of the first insulating base layer 13 is formed with fifth projected portions 39 in the both end portions in the left-to-right direction to project rearward from the rear end surface and each having a generally rectangular shape when viewed in plan view. Each of the fifth projected portions 39 projects rearward from the rear end surface of the first metal supporting layer 12. In the fifth projected portion 39, the inner surface in the left-to-right direction of the fifth projected portion 39 serves as a thirteenth interfitting surface 41 extending in the front-to-rear direction and the rear end surface of the fifth projected portion 39 serves as a fourteenth interfitting surface 42 extending in the left-to-right direction.

Thus, the first opposed surface 2 includes the thirteenth interfitting surface 41 and the fourteenth interfitting surface 42.

The front end surface of the second metal supporting layer 22, the front end surface of the second insulating base layer 23, and the front end surfaces of the second terminal portions 25 are formed to be flush with each other in the front-to-rear direction. The front end portion of the second insulating base layer 23 is formed with cut-away portions 40 in the both end portions in the left-to-right direction and each having a generally rectangular shape when viewed in plan view. The cut-away portions 40 are formed by cutting away the both end portions of the second insulating base layer 23 in the left-to-right direction rearwardly from the front end surface. Each of the cut-away portions 40 is retracted from the front end surface of the second metal supporting layer 22. In the cut-away portion 40, the both outer surfaces in the left-to-right direction serve as fifteenth interfitting surfaces 43 extending in the front-to-rear direction and the rear end surface of the out-away portions 40 serves as a sixteenth interfitting surface 44 extending in the left-to-right direction.

Thus, the second opposed surface 3 includes the fifteenth interfitting surfaces 43 and the sixteenth interfitting surface 44.

To obtain the wired circuit board 1, the first wired circuit board 11 and the second wired circuit board 21 are abutted against each other, as indicated by the arrows of FIG. 5(a). By this abutment, the fifth projected portions 39 are engaged with the cut-away portions 40, as shown in FIG. 5(c). As a result, the thirteenth interfitting surfaces 41 and the fourteenth interfitting surfaces 42 are brought into contact with the fifteenth interfitting surfaces 43 and the sixteenth interfitting surfaces 44, respectively, so that the first opposed surfaces 2 and the second opposed surfaces 3 interfit with each other.

It is further possible to, e.g., form the first opposed surface 2 from the first metal supporting layer 12, the first insulating base layer 13, and the first conductive layer 14 and form the second opposed surface 3 from the second metal supporting layer 22, the second insulating base layer 23, and the second conductive layer 24, as shown in FIG. 6.

In FIG. 6, the rear end surface of the first metal supporting layer 12, the rear end surface of the first insulating base layer 13, and the rear end surfaces of the first terminal portions 15 are formed to be flush with each other in the front-to-rear direction to form the first opposed surfaces 2. That is, the first opposed surfaces 2 include seventeenth interfitting surfaces 45 linearly inclined rightward from the left side toward the front side and eighteenth interfitting surfaces 46 linearly inclined leftward from the right side toward the front side, which continuously alternate. Thus, the seventeenth interfitting surfaces 45 and the eighteenth interfitting surfaces 46 form the first opposed surfaces 2 in a serrated shape when viewed in plan view.

The front end surface of the second metal supporting layer 22, the front end surface of the second insulating base layer 23, and the front end surface of the second conductive layer 24 are formed to be flush with each other in the front-to-rear direction. That is, the second opposed surfaces 3 include nineteenth interfitting surfaces 47 linearly inclined rightward from the left side toward the rear side and twentieth interfitting surfaces 48 linearly inclined leftward from the right side toward the rear side, which continuously alternate. Thus, the nineteenth interfitting surfaces 47 and the twentieth interfitting surfaces 48 form the second opposed surfaces 3 in a serrated shape when viewed in plan view.

To obtain the wired circuit board 1, the first wired circuit board 11 and the second wired circuit board 21 are abutted against each other, as indicated by the arrows of FIG. 6(a). By this abutment, the seventeenth interfitting surfaces 45 and the eighteenth interfitting surfaces 46 are brought into contact with the nineteenth interfitting surfaces 47 and the twentieth interfitting surfaces 48, respectively, so that the first opposed surfaces 2 and the second opposed surfaces 3 interfit with each other, as shown in FIG. 6(c).

In addition, the first opposed surfaces 2 are formed in the three layers of the first metal supporting layer 12, the first insulating base layer 13, and the first conductive layer 14, while the second opposed surfaces 3 are formed in the three layers of the second metal supporting layer 22, the second insulating base layer 23, and the second conductive layer 24. This can ensure more accurate positioning of the first wired circuit board 11 and the second wired circuit board 21 and more reliably prevent a relative displacement therebetween.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising:
a first wired circuit board; and
a second wired circuit board disposed to be opposed to the first wired circuit board in the same plane, wherein
a first opposed surface of the first wired circuit board facing the second wired circuit board and a second opposed surface of the second wired circuit board facing the first wired circuit board comprise at least two types of interfitting surfaces extending in different directions so as to mutually interfit the first opposed surface with the second opposed surface,
wherein
the first wired circuit board comprises a first insulating layer and a first conductive layer laminated on a surface of the first insulating layer, such that the first conductive layer extends beyond a first opposed surface of the first insulating layer,
the second wired circuit board comprises a second insulating layer and a second conductive layer laminated on a surface of the second insulating layer, such that the second conductive layer is set back from a second opposed surface of the second insulating layer,
the interfitting surfaces are provided in longitudinal end portions along a thickness of the first conductive layer and the second conductive layer,
a location of the interfitting surfaces of the first conductive layer and the second conductive layer is offset from a location of the first opposed surface of the first insulating layer and the second opposed surface of the second insulating layer when the first wired circuit board and the second wired circuit board are connected, such that the first and second opposed surfaces of the first and second insulating layers, respectively, contact each other, and the interfitting surfaces of the first conductive layer and the second conductive layer opposed to come into contact with each other define a first line of contact in a thickness direction, and the first opposed surface of the first insulating layer and the second opposed surface of the second insulating layer opposed to come into contact with each other define a second line of contact in the thickness direction, the first line of contact and the second line of contact being parallel to each other.

2. The wired circuit board according to claim 1, wherein
the first conductive layer comprises a first terminal portion for connection to the second conductive layer, and
the second conductive layer comprises a second terminal portion for connection to the first conductive layer, wherein
the interfitting surfaces are provided in the first terminal portion and in the second terminal portion, and
the first terminal portion and the second terminal portion are formed to have substantially equal lengths in a direction perpendicular to a direction in which the first terminal portion and the second terminal portion are connected.

3. The wired circuit board according to claim 1, wherein either the interfitting surfaces of the first wired circuit board or the interfitting surfaces of the second wired circuit board are formed in a chevron shape extending along a direction intersecting both of a direction in which the first wired circuit board and the second wired circuit board are opposed and a direction perpendicular to the opposed direction, while the other interfitting surfaces are formed in a trough shape interfitting with the chevron shape.

4. A wired circuit board comprising:
a first wired circuit board; and
a second wired circuit board disposed to be opposed to the first wired circuit board in the same plane, wherein
a first opposed surface of the first wired circuit board facing the second wired circuit board and a second opposed surface of the second wired circuit board facing the first wired circuit board comprise at least two types of interfitting surfaces extending in different directions so as to mutually interfit the first opposed surface with the second opposed surface, wherein
the first wired circuit board comprises a first metal supporting layer, a first insulating layer laminated on a surface of the first metal supporting layer, and a first conductive layer laminated on a surface of the first insulating layer,
the second wired circuit board comprises a second metal supporting layer, a second insulating layer laminated on a surface of the second metal supporting layer, and a second conductive layer laminated on a surface of the second insulating layer,
the interfitting surfaces are only provided in the first metal supporting layer and in the second metal supporting layer,
a location of the interfitting surfaces of the first metal supporting layer and the second metal supporting layer is offset from a location of opposed surfaces of the first insulating layer and the second insulating layer when the first wired circuit board and the second wired circuit board are connected, and
the interfitting surfaces of the first metal supporting layer and the second metal supporting layer opposed to come into contact with each other define a first line of contact in a thickness direction, and the opposed surfaces of the first insulating layer and the second insulating layer opposed to come into contact with each other define a second line of contact in the thickness direction, the first line of contact and the second line of contact being parallel to each other.

5. A connection structure between wired circuit boards for connecting a first wired circuit board and a second wired circuit board, wherein
the second wired circuit board is disposed to be opposed to the first wired circuit board in the same plane, and
a first opposed surface of the first wired circuit board facing the second wired circuit board and a second opposed surface of the second wired circuit board facing the first wired circuit board comprise two types of interfitting surfaces extending in different directions so as to mutually interfit the first opposed surface with the second opposed surface,
wherein
the first wired circuit board comprises a first insulating layer and a first conductive layer laminated on a surface of the first insulating layer, such that the first conductive layer extends beyond a first opposed surface of the first insulating layer,
the second wired circuit board comprises a second insulating layer and a second conductive layer laminated on a surface of the second insulating layer, such that the second conductive layer is set back from a second opposed surface of the second insulating layer,
the interfitting surfaces are provided in longitudinal end portions along a thickness of the first conductive layer and the second conductive layer,
a location of the interfitting surfaces of the first conductive layer and the second conductive layer is offset from a location of the first opposed surface of the first insulating layer and the second opposed surface of the second insulating layer when the first wired circuit board and the second wired circuit board are connected, such that the first and second opposed surfaces of the first and second insulating layers, respectively, contact each other, and
the interfitting surfaces of the first conductive layer and the second conductive layer opposed to come into contact with each other define a first line of contact in a thickness direction, and the first opposed surface of the first insulating layer and the second opposed surface of the second insulating layer opposed to come into contact with each other define a second line of contact in the thickness direction, the first line of contact and the second line of contact being parallel to each other.

6. A wired circuit board comprising:
a first wired circuit board; and
a second wired circuit board disposed to be opposed to the first wired circuit board in the same plane, wherein
a first opposed surface of the first wired circuit board facing the second wired circuit board and a second opposed surface of the second wired circuit board facing the first wired circuit board comprise at least two types of interfitting surfaces extending in different directions so as to mutually interfit the first opposed surface with the second opposed surface,
wherein
the first wired circuit board comprises a first insulating layer and a first conductive layer laminated on a surface of the first insulating layer,
the second wired circuit board comprises a second insulating layer and a second conductive layer laminated on a surface of the second insulating layer, the interfitting surfaces are provided only in the first insulating layer and in the second insulating layer, a location of the interfitting surfaces of the first insulating layer and the second insulating layer is offset from a location of opposed end surfaces of the first conductive layer and the second conductive layer which abut each other so as to be flush when the first wired circuit board and the second wired circuit board are connected, and the interfitting surfaces of the first insulating layer and the second insulating layer opposed to come into contact with each other define a first line of contact in a thickness direction, and the opposed end surfaces of the first conductive layer and the second conductive layer opposed to come into contact with each other define a second line of contact in the thickness direction, the first line of contact and the second line of contact being parallel to each other.

* * * * *